United States Patent
Doerr et al.

(10) Patent No.: US 9,020,001 B2
(45) Date of Patent: Apr. 28, 2015

(54) TUNABLE LASER USING III-V GAIN MATERIALS

(71) Applicant: Acacia Communications Inc., Maynard, MA (US)

(72) Inventors: Christopher Doerr, Maynard, MA (US); Eric Swanson, Maynard, MA (US)

(73) Assignee: Acacia Communications, Inc., Maynard, MA (US)

( * ) Notice: Subject to any disclaimer, the term of this patent is extended or adjusted under 35 U.S.C. 154(b) by 0 days.

(21) Appl. No.: 13/871,343

(22) Filed: Apr. 26, 2013

(65) Prior Publication Data

US 2014/0153601 A1 Jun. 5, 2014

Related U.S. Application Data

(60) Provisional application No. 61/638,660, filed on Apr. 26, 2012.

(51) Int. Cl.
*H01S 5/00* (2006.01)
*H01S 5/04* (2006.01)
*H01S 5/125* (2006.01)
*H01S 5/14* (2006.01)
*H01S 5/02* (2006.01)
*H01S 5/022* (2006.01)
*H01S 5/06* (2006.01)
*H01S 5/10* (2006.01)

(52) U.S. Cl.
CPC ................ *H01S 5/041* (2013.01); *H01S 5/125* (2013.01); *H01S 5/142* (2013.01); *H01S 5/0064* (2013.01); *H01S 5/021* (2013.01); *H01S 5/02248* (2013.01); *H01S 5/0612* (2013.01); *H01S 5/1032* (2013.01); *H01L 2224/48137* (2013.01)

(58) Field of Classification Search
USPC ....................................... 372/44.01
See application file for complete search history.

(56) References Cited

U.S. PATENT DOCUMENTS

| | | | |
|---|---|---|---|
| 5,499,256 A * | 3/1996 | Bischel et al. | 372/28 |
| 6,192,134 B1 * | 2/2001 | White et al. | 381/92 |
| 6,195,187 B1 * | 2/2001 | Soref et al. | 398/9 |
| 6,944,192 B2 * | 9/2005 | Prassas et al. | 372/6 |
| 7,605,010 B1 * | 10/2009 | Krutsick | 438/22 |
| 8,098,965 B1 * | 1/2012 | Baehr-Jones et al. | 385/2 |
| 2010/0046066 A1 * | 2/2010 | Fermann et al. | 359/341.5 |

\* cited by examiner

*Primary Examiner* — Xinning Niu
*Assistant Examiner* — Vu A Vu
(74) *Attorney, Agent, or Firm* — Jeffery J. Brosemer

(57) ABSTRACT

Disclosed herein are techniques, methods, structures and apparatus that provide a laser monolithically integrated in a silicon photonic integrated circuit (PIC) that is suitable for high-performance coherent fiber-optic telecommunications and other applications. Among the features of a laser according to the present disclosure, and in particular a hybrid InGaAsP/Si laser, is an integrated Si isolator to protect the laser from back reflections; optical, rather than electrical pumping; and coupling the optical pump using an InGaAsP grating coupler that acts simultaneously as a WDM coupler and laser mirror.

7 Claims, 7 Drawing Sheets

Top view

Side view

TUNABLE LASER USING III-V GAIN MATERIALS

CROSS REFERENCE TO RELATED APPLICATIONS

This application claims the benefit of U.S. Provisional Patent Application Ser. No. 61/638,660 filed Apr. 26, 2012 which is incorporated by reference in its entirety as if set forth at length herein.

TECHNICAL FIELD

This disclosure relates generally to the field of optical communications and in particular to techniques, methods and apparatus pertaining to lasers that use III-V material on silicon substrates and their use applications such as fiber optical communication transponders.

BACKGROUND

Contemporary optical communications and other systems oftentimes require tunable and non-tunable, low-noise, high power lasers that are compact and low cost. Consequently, methods, structures or techniques that facilitate the development or improvement in such lasers would represent a welcome addition to the art.

SUMMARY

An advance in the art is made according to an aspect of the present disclosure directed to a semiconductor laser including an optically pumped III-V gain material on silicon in a laser cavity including wavelength tuning elements followed by a silicon optical isolator.

Viewed from a first aspect, the present disclosure is directed to laser employing a III-V gain material on silicon that is not electrically pumped, has a monolithically integrated optical isolator, is tunable and is advantageously able to be integrated with other silicon photonic integrated circuits.

Viewed from another aspect, the present disclosure is directed to a design of a laser that uses a grating coupler to efficiently couple pump light while simultaneously providing laser cavity gain at another wavelength. This optical pumping advantageously physically separates the main heat source from the laser and eliminates the need to add lossy dopants, metal contacts and wafer processing steps that plague the prior art.

Advantageously, the isolator employed according to the present disclosure further reduces laser noise by eliminating back reflections and allows the one to monolithically couple a PIC laser to other multi-function PIC circuits. Of further advantage, by physically separating the pump laser a significant amount of electrical noise is eliminated—thereby eliminating one cause of relative intensity noise (RIN) and phase noise.

According to yet another aspect of the present disclosure, a grating coupler is used to simultaneously optically couple the pump laser light at the pump laser wavelength and act as a laser cavity mirror at the III-V on silicon laser wavelength.

Of particular advantage, PIC lasers constructed according to the present disclosure do not need to be actively cooled. The use of the remote laser pump eliminates much of the waste heat and the PIC laser may be advantageously heated to above the normal expected ambient temperature environment. When the ambient temperature environment is hot (but below the laser operating temperature) little heater power is applied. When the ambient temperature experienced around the PIC laser is lower, more PIC laser heater power is applied. The PIC laser structure is designed to have a high thermal impedance with the surrounding environment so as not to unduly drive PIC heater power. In this manner an uncooled III-V laser on silicon is achieved.

According to yet another aspect of the present disclosure, the optically pumped silicon PIC laser is monolithically integrated with additional photonic circuitry such as a transmitter, a receiver, or even transceivers. Furthermore, a same pump laser that is pumping the III-V material on one laser may also be employed to pump one or more additional lasers.

BRIEF DESCRIPTION OF THE DRAWING

A more complete understanding of the present disclosure may be realized by reference to the accompanying drawings in which.

DETAILED DESCRIPTION

Figure 1:
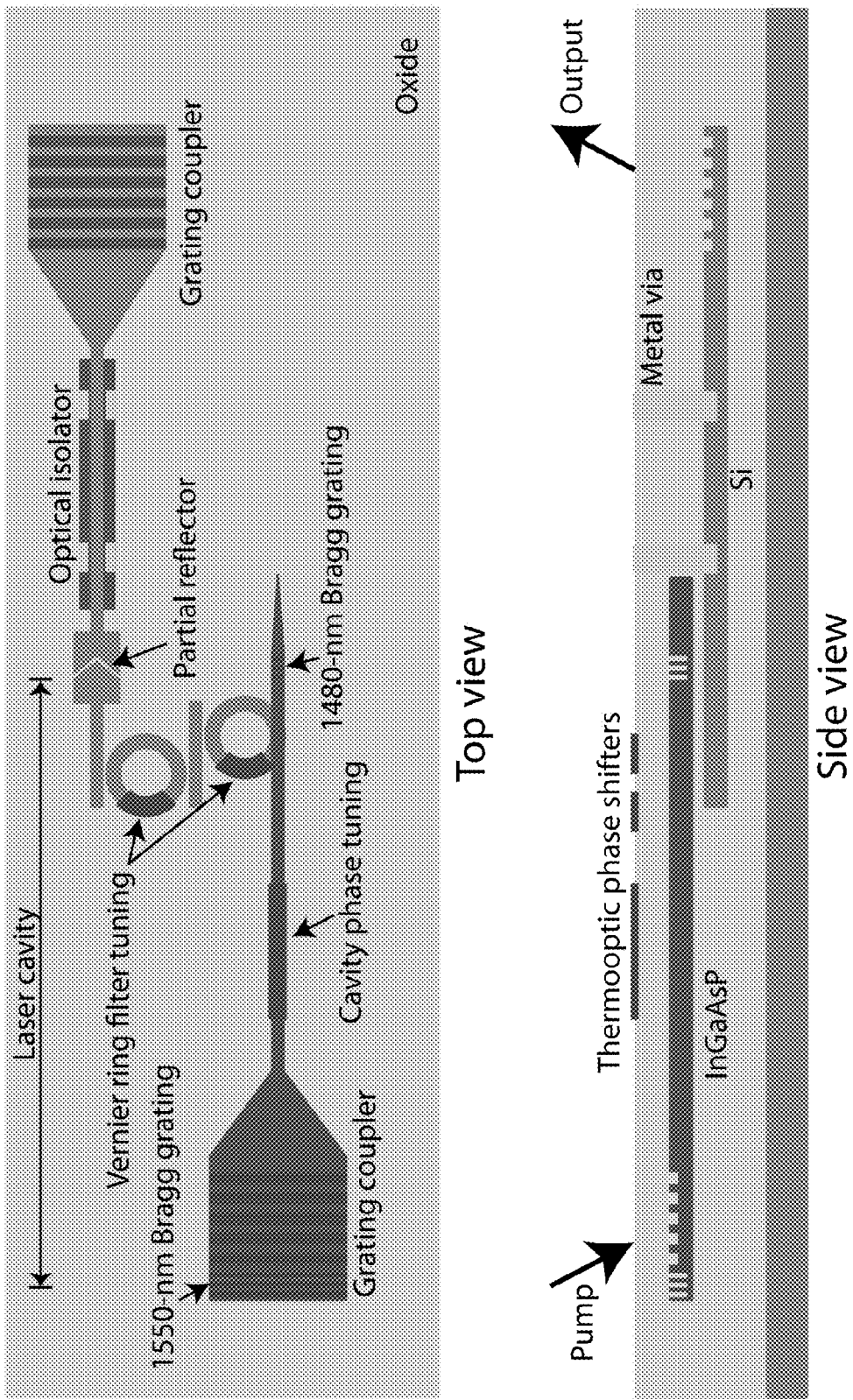
FIG. 1 shows a schematic top-view and side-view of one embodiment of a laser and isolator configuration according to an aspect of the present disclosure wherein the laser cavity is indicated in the top view.

The following merely illustrates the principles of the disclosure. It will thus be appreciated that those skilled in the art will be able to devise various arrangements which, although not explicitly described or shown herein, embody the principles of the disclosure and are included within its spirit and scope.

Furthermore, all examples and conditional language recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently-known equivalents as well as equivalents developed in the future, i.e., any elements developed that perform the same function, regardless of structure.

Thus, for example, it will be appreciated by those skilled in the art that the diagrams herein represent conceptual views of illustrative structures embodying the principles of the invention.

In addition, it will be appreciated by those skilled in art that any flow charts, flow diagrams, state transition diagrams, pseudocode, and the like represent various processes which may be substantially represented in computer readable medium and so executed by a computer or processor, whether or not such computer or processor is explicitly shown.

In the claims hereof any element expressed as a means for performing a specified function is intended to encompass any way of performing that function including, for example, a) a combination of circuit elements which performs that function or b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. Applicant thus regards any means which can provide those functionalities as equivalent as those shown herein. Finally, and unless otherwise explicitly specified herein, the drawings are not drawn to scale.

Thus, for example, it will be appreciated by those skilled in the art that the diagrams herein represent conceptual views of illustrative structures embodying the principles of the disclosure.

By way of some additional background, it is noted that tunable and non-tunable low-noise high power lasers that are compact and low cost are an important component in fiber optic telecommunication systems and many other applications such as medical imaging and remote sensing. Those skilled in the art will appreciate that there is a shift underway in how fiber-optic transceivers are designed. More specifically, optical transponders are evolving away from simple, direct detection systems having simple signaling formats like on/off keying to advanced modulation formats with both direct and coherent detection combined with high speed digital signal processing ASICs.

As is known, such ASICs can contain 100M's of gates and process multi-Tb/s of information such that they are capable of automatically compensating for transmission link impairments. Notably, a key component in these systems is a low-noise tunable laser source.

Lasers used in contemporary high performance fiber optic networks are typically individually packaged III-V lasers having thermal electric coolers and various other sub-components. Such lasers are typically difficult to reduce in size, power, and costs and do not conveniently integrate monolithically with photonic integrated circuits.

Silicon photonic integrated circuits (PICs) are expected to be a key solution for a variety of photonic needs including making new and novel laser structures and photonic integrated circuits [see, e.g., C. R. Doerr, N. Dupuis, and L. Zhang, "Optical Isolator Using Two Tandem Phase Modulators, Opt. Lett., 36(21):4293-4295, November 2011]. Advantageously, such silicon PICs can be produced on relatively large, 200- to 300-mm wafers with high yield and can currently be configured to provide filtering, routing, modulation, and light detection functions.

Notwithstanding these desirable characteristics however, those skilled in the art will recognize that it remains highly difficult to generate light on silicon. Silicon and its nearly lattice-matched family, such as Ge, are indirect-bandgap materials, and silicon PICs must operate in challenging high-temperature environments because they are either monolithically integrated with or operated in close proximity to electronics.

Consequently, numerous attempts have been made to attach III-V material to silicon wafers via wafer bonding or re-growth and electrically pumping the gain region to make lasers. However electrical pumping of III-V material on silicon has many drawbacks, such as waste heat that is generated due to electrical to optical inefficiencies, and numerous problems related to the need to add lossy dopants, metal contacts and risky and expensive wafer processing steps. Also, even approaches that may successfully use optical pumping of III-V gain elements on silicon substrates, there still exist difficulties associated with making lasers low-noise and high power due to back reflections from disturbing the desired laser operational characteristics as well as the lack of compact and efficient laser cavities and laser pump coupling schemes.

With reference now to FIG. 1, it shows but one embodiment of a laser structure according to an aspect of the present disclosure. As may be observed, the main structure includes silicon wire waveguides on a silicon-on-insulator (SOI) wafer having InGaAsP gain material wire waveguides positioned on top. One side of the laser cavity includes of a 1-D grating coupler in InGaAsP material. This grating coupler design is configured according to the present disclosure in that it is phase-matched to couple in the 980- or 1480-nm pump at a certain angle (~43 or ~5 degrees, respectively, from normal, tilted away from the waveguide, depending on the waveguide thickness and groove depth) but acts as a reflector at 1550 nm. This reflector originates from the 2nd-order Bragg reflection when the pitch exactly equals the effective wavelength in the wave guide.

To enhance this Bragg reflection a non-50% grating duty cycle can be used. To insure that all the 1550-nm light is reflected back into the cavity, there is a 1550-nm first-order Bragg grating at the left end of the grating coupler. Those skilled in the art will readily appreciate a significant advantage of this design is that the pump couples directly to the InGaAsP, and it does this in a wide waveguide. In addition, the configuration shown in FIG. 1 avoids or eliminates two-photon absorption of the pump in a silicon waveguide, and two-photon absorption in the InGaAsP waveguide is minimized—due in part to the waveguide volume being very large at the pump launch point.

Operationally, the 980- or 1480-nm light will pump the InGaAsP waveguide, which will exhibit a length of ~1 mm. The longer the cavity, the narrower the linewidth achieved.

As shown, the 1550-nm light guided in the InGaAsP waveguide couples to a Si ring resonator below it. As depicted in FIG. 1, the ring has a constant bend radius, but alternatively other designs can be used such as a race-track resonator to increase the coupling strength. With a proper coupling coefficient, this light builds up in the resonator at a specific set of wavelengths and couples to a straight Si waveguide and to a second ring resonator, which has a slightly different free-spectral range than the first ring. Advantageously, since both rings can be tunable via thermooptic phase shifters, and by Vernier tuning, tuning over the C-band can be achieved. Similar two-ring Vernier tuning has been demonstrated in an InP laser [See, e.g., T. Segawa et al., "Monolithically Integrated Filter-Free Wavelength Converter with Widely Tunable Double-Ring Resonator Coupled Laser", IPRM 2008].

Pump light is reflected back for a second pass through the gain section by a Bragg grating in the InGaAsP just after the 1550-nm light has been coupled to the first ring resonator. In a preferred embodiment, care is taken to minimize 1550-nm reflection from this grating. This waveguide is slowly tapered to a point afterward in order to dissipate any residual 1550-nm light not coupled into the ring resonator.

The rightmost portion of the laser cavity is closed by a partial reflector. This partial reflector comprises of a V-shape groove etched into a multimode interference (MMI) coupler [See, e.g., L. Xu, X. J. M. Leijtens, B. Doctor, T. deVries, E. Smallbrugge, F. Karouta and M. K. Smit, "MMI-reflector: A Novel On-Chip Reflector for Photonic Integrated Circuits" ECOC, 2009]. This 45-degree mirror set can provide an arbitrarily high reflectance, set by the width and depth of the etched groove.

The portion of light exiting the laser cavity is directed to the optical isolator and then to a Si grating coupler. In one configuration according to the present disclosure, this coupler is removed and the laser is integrated with an entire transmitter and/or coherent receiver PIC structure (see for example FIG. 4).

Figure 2:
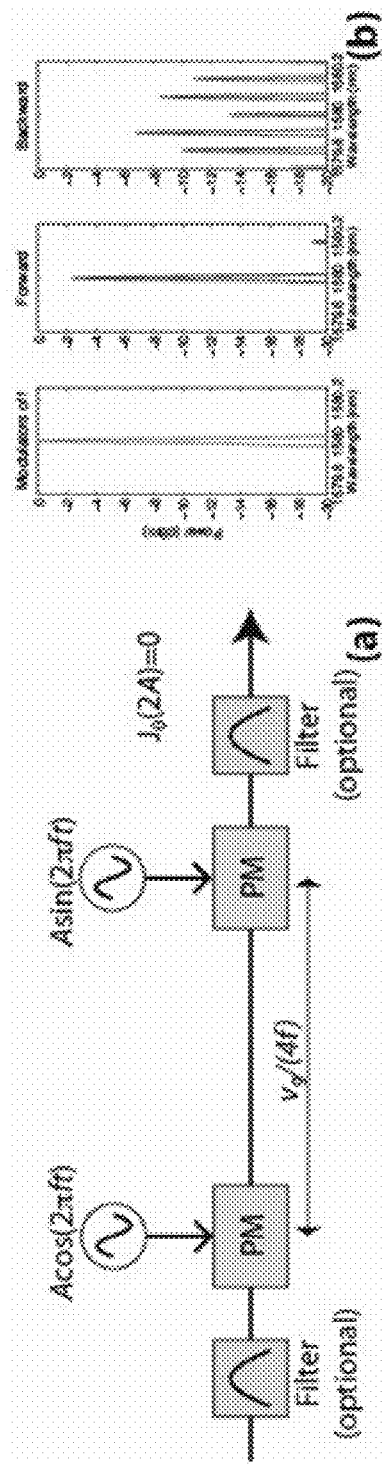
FIG. 2 shows a schematic of a monolithic silicon optical isolator along with data on the transmitted throughput with the modulator off, the forward light with the modulator on, and the reverse light with the modulator on according to an aspect of the present disclosure.

A schematic of one embodiment of an optical isolator according to an aspect of the present disclosure is shown in FIG. 2. As may be observed, it includes a tandem arrangement of two sinusoidally driven Si phase modulators [See, C. R. Doerr, N. Dupuis, and L. Zhang, "Optical Isolator Using Two Tandem Phase Modulators", Opt. Lett., 36(21):4293-4295, November 2011].

Preferably, the modulators are synchronized such that light propagating in one direction is not affected by the modulators, whereas light propagating in the other direction experiences a strong net phase modulation. This magnitude of phase modulation is chosen so as to eliminate the carrier signal. This value is obtained when each of the two phase shifters is driven with $0.777\pi$ phase shift peak-to-peak. By putting the modulator in silicon, it can be monolithically integrated with the laser and there is no need to make any electrical connections to the III-V layer, and only one material composition in the III-V layer is needed.

While FIG. 2 shows one simple structure, other configurations such as those employing multiple stages are contemplated within the scope of this disclosure. In such multiple stage configurations, an optical filter, such as a ring resonator may be positioned between stages to further extinguish back reflections. To save power the drive impedance of the PM modulator can be a resonant circuit. In one preferred embodiment only a single frequency drive is used, thus significant power is saved by using a high-Q RF resonant circuit.

In one exemplary embodiment according to the present disclosure, a method to reduce power consumption is employed. More specifically, and unlike contemporary, prior-art coherent tunable lasers, the laser shown in FIG. 1 according to the present disclosure does not employ any cooling structures or apparatus. Instead, by having the pump laser physically distant from the III-V laser, the tunable III-V laser is able to run efficiently at a case temperature of substantially 70 C.

In order to stabilize the optical intra-cavity filters, a heater is placed on the PIC that maintains the laser at the maximum possible temperature over the operating conditions. This results in an additional power consumption characteristic that will ordinarily be seen only at cold start.

Notably, in some embodiments, it is desirable that the PIC structures minimize the thermal coupling to the external environment so that if the environment is cold there is a high thermal impedance between the laser and the surrounding structure and we do not need to supply excess amounts of heat to keep the laser stable. To achieve this reduced thermal coupling, one embodiment according to the present disclosure includes deep trenching around the heaters and undercutting of the silicon with etching or other techniques [See, e.g., R. Kasahara, K. Wantanabe, M. Itoh, Y. Inoue, and A. Kaneko, "Extremely Low Power Consumption Thermooptic Switch With Suspended Ridge and Silicon-Silica Hybrid Waveguide Structures", ECOC, number P.2.02, 2008].

According to yet another aspect of the present disclosure, the laser and isolator can be fabricated as follows: an SOI wafer with 220-nm of Si on a 2000-nm buried oxide layer is patterned and etched with the Si waveguides and grating coupler. For the isolator phase modulators p and n implants can be utilized, as well as an activation anneal.

Then, the waveguides are buried in oxide and then chemical-mechanical polished (CMP) to a thickness of 50-100 nm above the Si. Following this waveguide preparation, an InP wafer with a ~300-nm grown layer of InGaAsP with a bandgap of ~1.55 mm and a ~20-nm oxide on top is low-temperature bonded to the Si wafer [See., e.g., C. R. Doerr, L. Chen, L. Buhl, and Y. Chen, "Eight-Channel SiO/SiN/Si/Ge CWDM Receiver", IEEE Photon. Tech. Lett., 23(17):1201-1203, 2011]. For this process, a low-temperature hydrophilic oxygen-plasma-assisted bonding is preferably used.

A relatively thick oxide layer is used that advantageously can quench the bonding byproducts from hydrophilic bonding [See., e.g., D. Liang, A. W. Fang, J. E. Bowers, "100 mm Wafer-Scale InP based Epitaxial Transfer for Hybrid Silicon Evanescent Lasers", Electron. Comp. and Tech. Conf, pp. 979-984, 2008]. This quenching obviates trenches and/or vias on the Si substrate, increasing effective wafer area and reducing processing steps. One approach begins with pieces of the InP wafer and bonds those to the Si wafer, wet-etch off the InP substrate, then pattern the InGaAsP waveguides and grating coupler. Finally it can all be buried in more oxide and the metal thermooptic heaters and aluminum leads and bond pads can be deposited.

Figure 3:
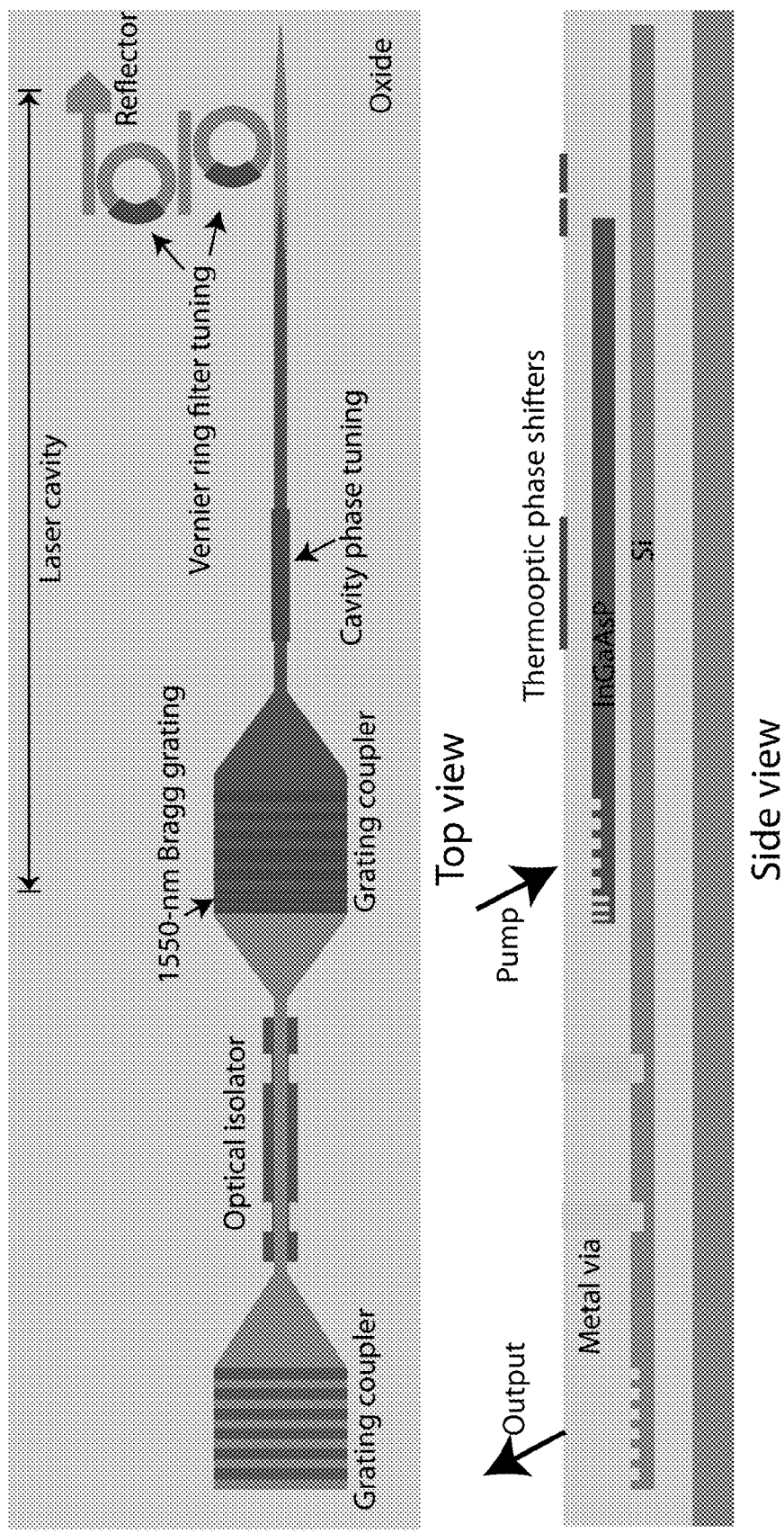
FIG. 3 shows another schematic configuration of a III-V on silicon laser with an isolator structure according to an aspect of the present disclosure.

FIG. 3 shows yet another laser design according to an aspect of the present disclosure. Notably, there exist at least two differences between the design of FIG. 3 and the design shown previously in FIG. 1. The first difference is that the laser output is now from the left-side of the cavity—as depicted in the figure. Such a design exhibits a higher output power because the output does not pass through the ring resonators and partial reflector. The second difference between the structure of FIG. 3 and the structure of FIG. 1 is that the silicon waveguide is kept underneath the InGaAsP waveguide. This configuration allows the InGaAsP to be bonded to the SOI wafer before any etching has been done, simplifying the processing. Finally, laser depicted in FIG. 3 has a lower confinement factor in the InGaAsP, which increases the saturation power and the coupling from the InGaAsP waveguide to the Si waveguide with the ring resonators is done adiabatically by tapering down the InGaAsP waveguide.

Figure 4:
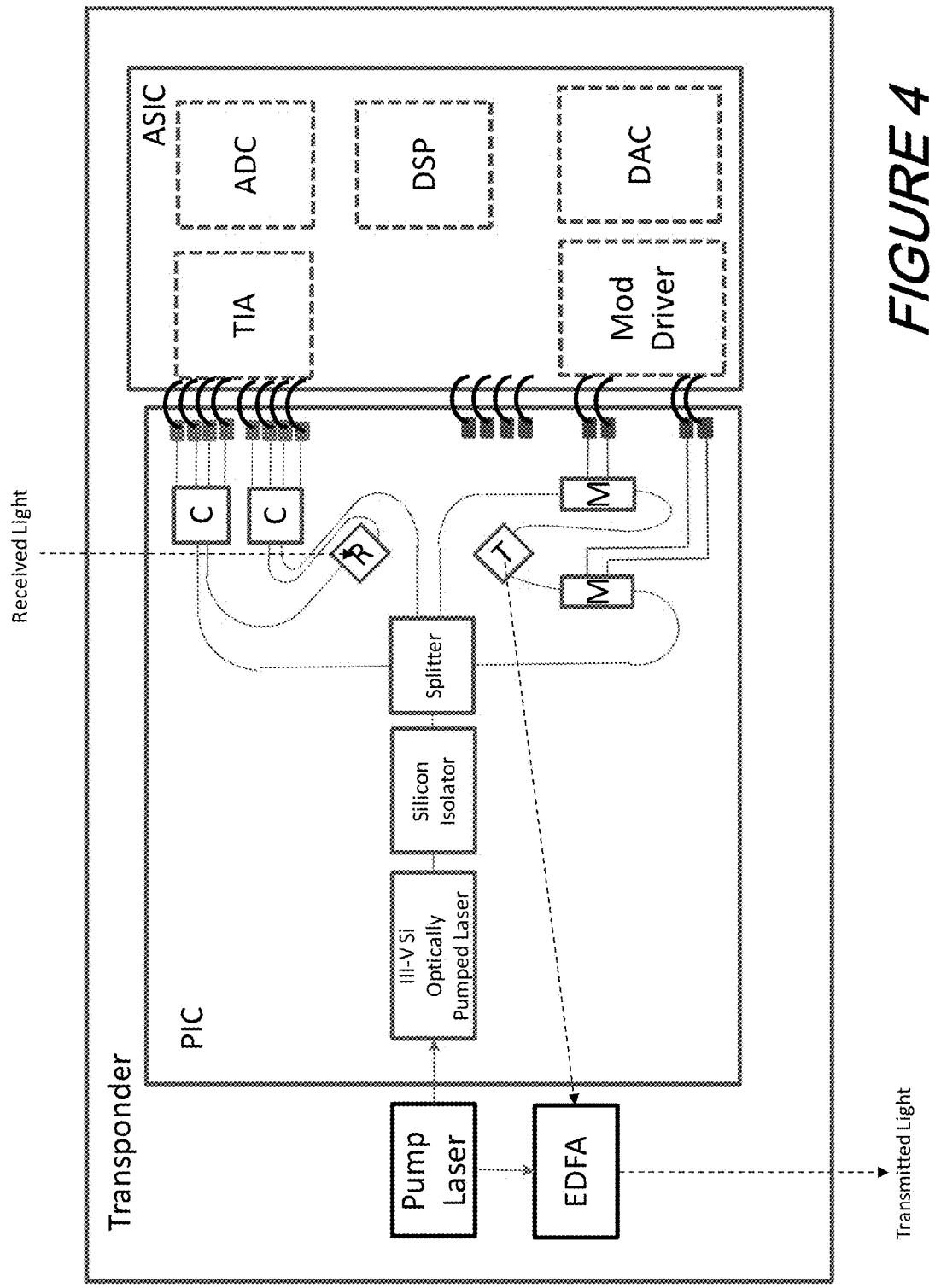
FIG. 4 shows a schematic configuration of a III-V on silicon laser with an isolator that is monolithically coupled to an entire dual polarization modulator and dual polarization received photonic integrated circuit according to an aspect of the present disclosure wherein the PIC is coupled to an ASIC housed in a transponder circuit.

FIG. 4 shows another schematic embodiment according to the present disclosure in which a complete optical transponder is shown. Shown in FIG. 4 is an external pump laser optically coupled to the III-V on silicon laser via fiber optical pigtail (shown schematically as a dotted line) and a 1D grating coupler or other suitable coupling method. The III-V on silicon laser is monolithically integrated with other photonic and electrical components. In the example configuration depicted in FIG. 4 there is a dual polarization modulator and a dual polarization dual balanced receiver on the PIC.

The III-V on silicon laser is coupled to the silicon isolator using a monolithic silicon wire waveguide or other monolithic waveguide structure. The isolator is waveguide coupled to a 1 to 4 splitter. Advantageously, this can be constructed using a tree of 1×2 splitters or other suitable means.

Two arms of the splitter are in communication with two modulators that modulate phase and/or amplitude of each of two polarizations. These I-Q modulators can be constructed using nested Mach-Zehnder interferometers containing silicon depletion phase modulators or other types of silicon modulators.

The two modulator outputs are coupled to a 2D grating coupler ("T") that combines the two modulated polarizations and couples them into a single output fiber (shown as a dotted line). The output fiber can optionally couple to an EDFA booster amplifier that can be pumped from the same pump laser. The transmitted light is sent into the fiber optic network.

Light received from the fiber optic network enters the 2D grating coupler ("R"). Its polarization is split into two waveguides by the grating coupler. Both components are TE-polarized in the PIC.

Each component of the received light is combined with light from the III-V optically pumped laser in 2×4 multimode interference (MMI) coupler ("C") serving as a 90-degree hybrid. The signals are directed to eight Ge photodiodes (PDs) shown as small rectangles at the output of C. The PDs signals are wire-bonded to differential TIAs.

On-chip capacitors can be included for biasing the PDs. The TIA's can be located next to, or on top of, the PIC. Alternatively, as shown in Figure, the TIA can be located in close proximity to an ASIC that does additional electrical signal processing.

The connection from the PIC to the ASIC can be via wire bonds (as shown) or, in a more complex approach, through silicon vias to die bonds and a FR4 or CMOS substrate interconnect as is known in the art. Instead of trough silicon vias, the PIC can also be flip chip mounted to lower the inductance of the interconnects.

Advantageously, the ASIC can also be used to drive the modulators as shown in FIG. 4. Alternatively a separate MIMIC or other type of amplifier can be used. The ASIC may contain specialized functions such as an ADC, a DAC, and other customized DSP for suitably processing received light and preprocessing transmitted light. Of further advantage, the PIC may include other miscellaneous circuitry such as power taps, thermal phase trims to allow for the various transmitter and receiver components to be properly biased and for the entire PIC to maintain stable temperature operation. Finally, note that the pump laser can be located inside the transponder (as shown) or located external to the transponder.

Figure 5:
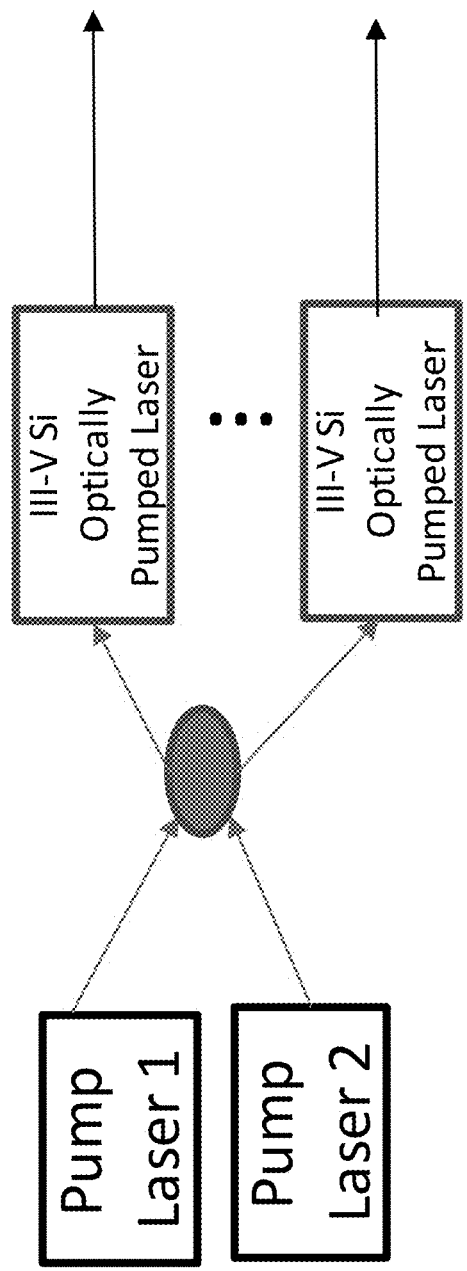
FIG. 5 shows a schematic of an external pump laser useful to pump two or more III-V on silicon lasers according to an aspect of the present disclosure including an optical use of a back-up laser pump for increased reliability.

Still according to another aspect of the present disclosure, the pump laser may pump more than one III-V on silicon laser as shown in FIG. 5. For added reliability additional pump lasers can be used so that if one fails the system can switch over to a secondary pump laser. Finally, and as shown in FIGS. 1, 3, and 4, 1D or 2D grating couplers may be used to couple light from external to the PIC into various waveguides within the PIC.

Figure 6:
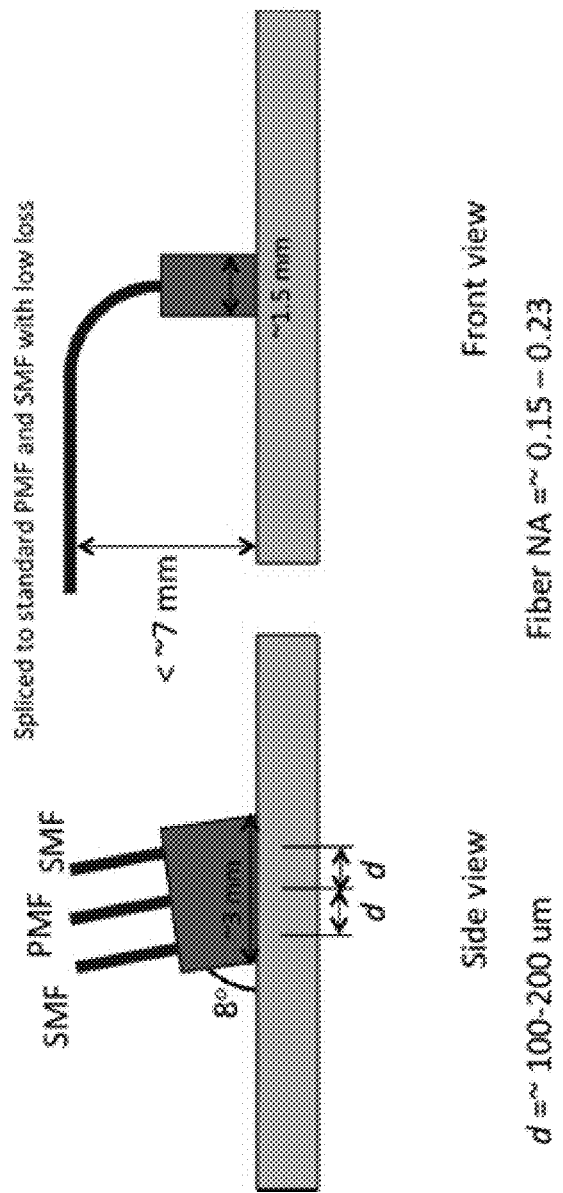
FIG. 6 shows a schematic of a fiber butt coupling according to an aspect of the present disclosure.
Figure 7:
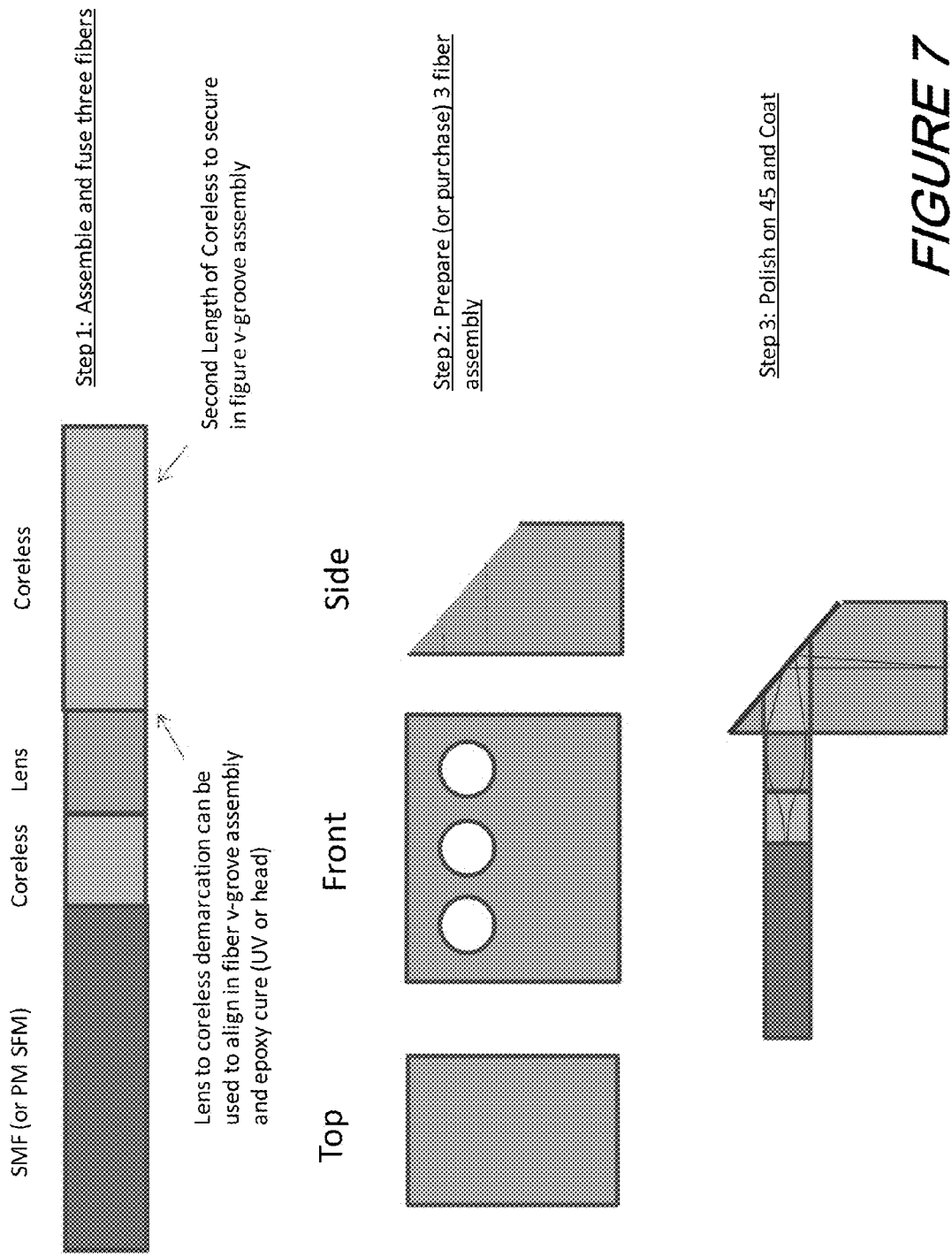
FIG. 7 shows a schematic of an exemplary configuration in which lenses are used to couple light from fibers to the grating couplers according to an aspect of the present disclosure.

As may be appreciated, it is important to utilize robust techniques for aligning one or more fibers to the corresponding grating couplers. FIGS. 6 and 7 show two exemplary structures and embodiments for coupling light into or out of grating couplers such as those used in devices according to the present disclosure.

More specifically, FIG. 6 shows three fibers housed in a precision block such that their spacing and angle of incidence can be precisely controlled. The fibers are secured in place using an epoxy or other means and the ends of the block are polished to ensure a smooth optical interface. Although three fibers are shown, the block may contain one or more fibers.

One appreciated advantage of housing three fibers in one block is that during manufacturing only one alignment step is needed. For example—and with reference to FIG. 4—there are four grating couplers namely, the input grating coupler R, the output grating coupler T, and the III-V Silicon optically pumped laser 1D coupling.

By configuring the PIC to have these three grating couplers in a precise geometry three fibers can be attached to three grating couplers in one step. And while FIG. 4 shows only that R and T are in alignment, it is understood that the laser 1D grating coupler could also be in close proximity to R and T such that the single fiber butt coupling assembly shown in FIG. 6 can be used during assembly. In an alternate embodiment three separate fiber butt coupling blocks could be used. To align the fibers to the gratings, fudicials may be located on the PIC to aid a human or automated interface to get in close proximity to the 1D fiber and then heat or UV curing epoxy may be used to secure them in place. Alternatively one may use active laser alignment by coupling light into the fibers and monitoring the light coupled into the PIC via photo detectors or other techniques.

In yet another exemplary embodiment according to the present disclosure, lenses may be used to couple from the fibers to the grating couplers. One example of such a configuration is shown schematically in FIG. 7. This particular example shown in FIG. 7 also includes a turning mirror to allow the entire PIC structure to have a lower profile.

Appreciably, to construct the lens the single mode fiber may be fusion spliced to a section of coreless fiber and then fusion spliced to a section of MM fiber or graded index fiber (GRIN). The coreless fiber allows the SMF mode to diffract and expand. When the desired beam waist is realized, the MM section of fiber is used to collimate and then focus the light onto the end of block. The grating coupler is located at the end of the block.

Those skilled in the art will readily appreciate that while the methods, techniques and structures according to the present disclosure have been described with respect to particular implementations and/or embodiments, those skilled in the art will recognize that the disclosure is not so limited. Accordingly, the scope of the disclosure should only be limited by the claims appended hereto.

The invention claimed is:

1. An optically pumped, III-V silicon laser comprising:
a laser element having a gain medium disposed within a laser cavity that generates laser light in response to pump light;
a grating coupler for coupling the pump light emitted by a pump laser to the laser element; and
a silicon optical isolator including a pair of phase modulators in tandem, wherein one of said pair of modulators is driven by a sine wave at frequency f, and the other modulator is driven by a cosine wave at frequency f, wherein the two phase modulators are separated by a waveguide propagation distance defined by $v_g/(4f)$ where $v_g$ is the optical group velocity in the waveguides;
wherein said grating coupler operates as a laser cavity mirror and pump coupler while simultaneously providing laser cavity gain at another wavelength.

2. The laser according to claim 1 wherein the grating coupler includes a first-order Bragg grating at an end opposite a laser output.

3. The laser according to claim 1 wherein the pump laser operates to pump a section of an erbium fiber amplifier.

4. The laser according to claim 1 which is not actively cooled during laser operation.

5. The laser according to claim 1 further comprising a silicon transceiver photonic integrated circuit to which the laser is coupled.

6. The laser according to claim 1 wherein the pump laser is configured to pump two or more lasers simultaneously.

7. The laser according to claim 1 further comprising a III-V waveguide that vertically couples the laser element to a silicon ring resonator.

* * * * *